United States Patent [19]

Chi

[11] Patent Number: 5,015,802

[45] Date of Patent: May 14, 1991

[54] COMPUTER CASING CONNECTOR

[75] Inventor: Liu Chi, Taoyuan, Taiwan

[73] Assignee: Enlight Corporation, Taoyuan, Taiwan

[21] Appl. No.: 573,621

[22] Filed: Aug. 27, 1990

[51] Int. Cl.⁵ .............................................. H05K 9/00
[52] U.S. Cl. ................................ 174/35 GC; 174/35 R; 439/609; 24/293; 24/295
[58] Field of Search .......... 174/35 GC, 35 R, 35 MS; 24/293, 294, 295; 220/677, 680, 681, 690, 693; 439/271, 272, 273, 276, 278, 609; 219/10.55 D, 10.55 R; 361/424

[56] References Cited

U.S. PATENT DOCUMENTS

| | | | |
|---|---|---|---|
| 2,065,651 | 12/1936 | Burton | 174/35 GC |
| 2,844,644 | 7/1958 | Soule, Jr. | 174/35 GC |
| 3,366,918 | 1/1968 | Johnson et al. | 174/35 GC |
| 4,402,118 | 9/1983 | Benedetti | 29/289 |
| 4,762,966 | 8/1988 | Kosanda | 174/35 GC |
| 4,952,752 | 8/1990 | Roun | 174/35 R |

Primary Examiner—Leo P. Picard
Assistant Examiner—Bot L. Ledynh
Attorney, Agent, or Firm—Ladas & Parry

[57] ABSTRACT

A computer casing connector comprising an electrically conductive U-shaped body, one limb of which has a plurality of snap catches to snap on one piece of a computer casing and the other limb of which has a plurality of resilient arcuate members to contact with the other piece of the computer casing when the casing is assembled so as to provide an electrical connection between the casing pieces and, thus, prevent the radiation of electromagnetic waves out of the casing.

6 Claims, 4 Drawing Sheets

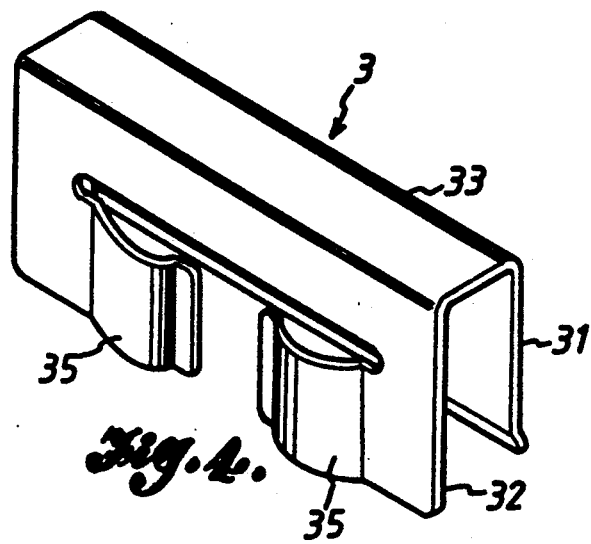
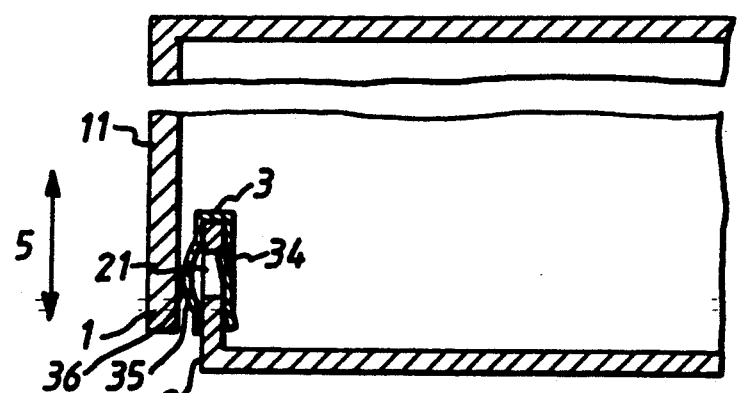

COMPUTER CASING CONNECTOR

FIELD OF THE INVENTION

The invention relates to computer casings and in particular to a casing connector which provides electrical connection and tight spatial contact between separate pieces of a computer casing so as to reduce the electromagnetic interference with other electronic devices when the computer is in operation.

BACKGROUND OF THE INVENTION

As is well-known, electronic devices, when in operation, generate electromagnetic waves. These waves so generated interfere with other electronic devices of which the operations may be mainly dependent upon the transmission of electromagnetic waves, such as electronic communication devices, televisions, and radios. Computers, being electronic devices, generate unwanted electromagnetic waves when in operation and the faster the computer the worse the interference problem. To solve the problem interference resulting from the operation of computers, it is conventional to use a metallic casing to cover and shield electronic elements of the computer.

Conventionally, personal computer casings are made of two pieces, an upper one and a lower one. Usually, gaps exist between these two pieces after they are assembled together. These gaps provide a way for electromagnetic waves to exit the casing and radiate out of the casing. To overcome the problem, a resilient strip is provided in each of the two pieces. These strips, owing to their resiliency, provide a tight and close contact between the casing pieces and also establish electrical conductivity therebetween so as to reduce the radiation of electromagnetic waves out of the casing. This design, however, has the disadvantage of being difficult to assemble.

Taiwanese patent number 78,200,940 discloses a casing connector which is made of conductive material and comprises a plurality of arcuate surfaces and fastening means to fix on one piece of the casing. The arcuate surfaces provide a spatial contact between the casing pieces. The disadvantage is that there must be open slots provided on the casing pieces for the connector to fix thereon. This restricts the applicability of the connector to different designs of computer casings. Further, the open slots also have a negative influence on the mechanical strength of the computer casing.

It is therefore the object of the present invention to provide a computer casing connector without the above-mentioned disadvantages.

OBJECTS OF THE INVENTION

It is an object of the present invention to provide a computer casing connector which provides a tight spatial contact and an electrically conductive connection between computer casing pieces.

It is another object of the present invention to provide a computer casing connector which is easy to install and durable.

It is a further object of the present invention to provide a computer casing connector which has more applicability to different computer case designs.

To achieve these objects, there is provided a computer casing connector which comprises an electrically conductive U-shaped body, one limb of which has a plurality of snap catches and the other limb of which has a plurality of arcuate resilient members to contact with the other piece of the computer casing when the casing is assembled so as to provide an electrical connection between the casing pieces and, thus, prevent the radiation of electromagnetic waves out of the casing.

Other objects and advantages of the present invention will be apparent from the following description of the preferred embodiments taken in connection with the accompanying drawings wherein:

BRIEF DESCRIPTION OF THE DRAWINGS

FIG. 4 is a perspective view of another embodiment of the computer casing connector in accordance with the present invention;

FIG. 5 is a cross-sectional view showing the application of the embodiment shown in FIGS. 2 and 3;

DETAILED DESCRIPTION OF THE PREFERRED EMBODIMENTS

Figure 1:
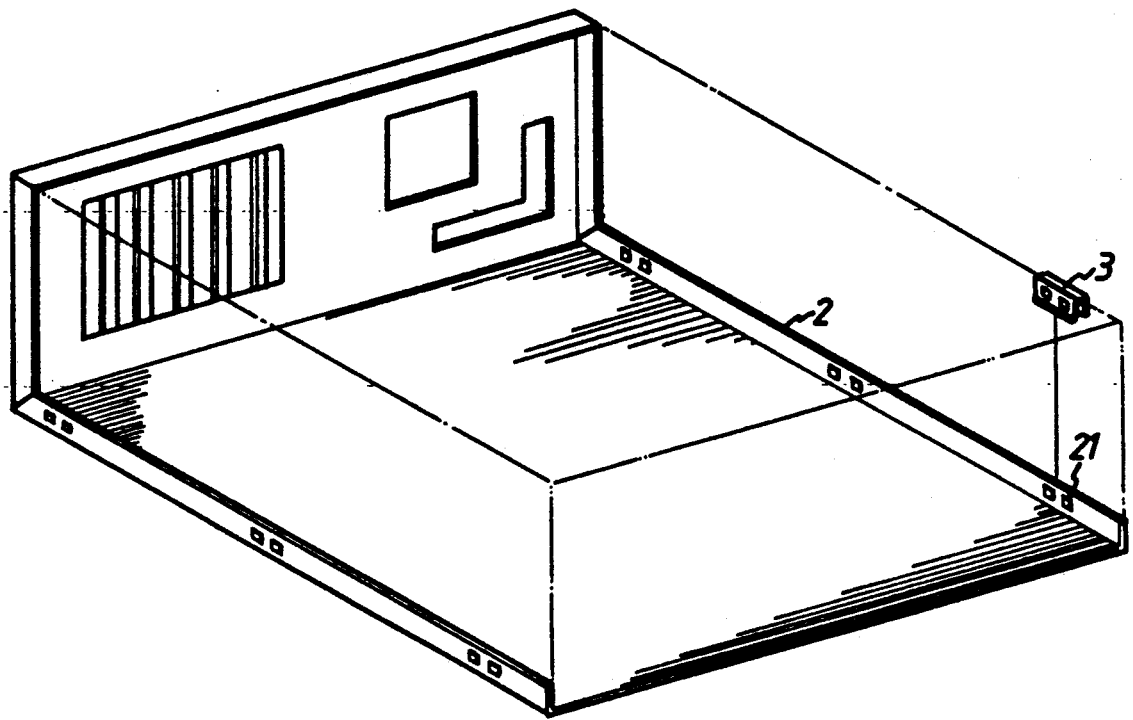
FIG. 1 is an exploded view of a computer casing together with a casing connector in accordance with the present invention.

With reference to the drawings and in particular to FIG. 1, a computer casing connector in accordance with the present invention, generally designated by reference numeral 3, is used to provide a tight and close contact between an upper piece 1 and a lower piece 2 of a computer casing, generally made of metal to cover and shield electronic elements (not shown) therein and prevent the radiation of electromagnetic waves generated by the electronic elements out of the casing.

Figure 2:
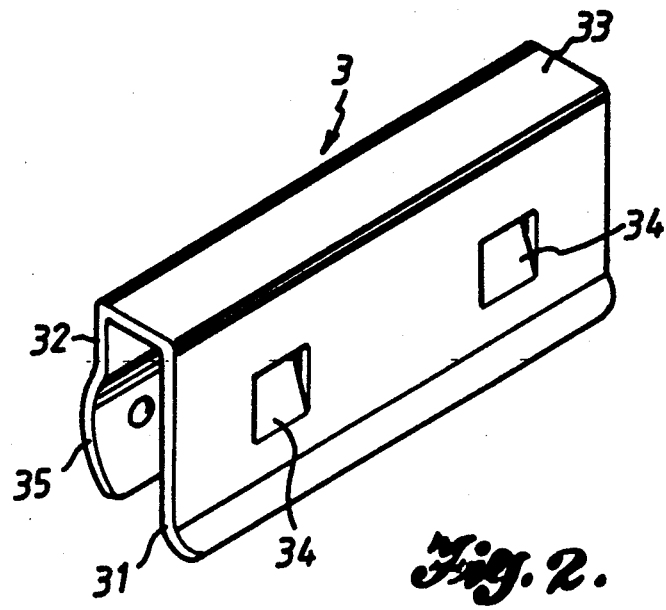
FIG. 2 is a perspective view of an embodiment of the computer casing connector in accordance with the present invention.
Figure 3:
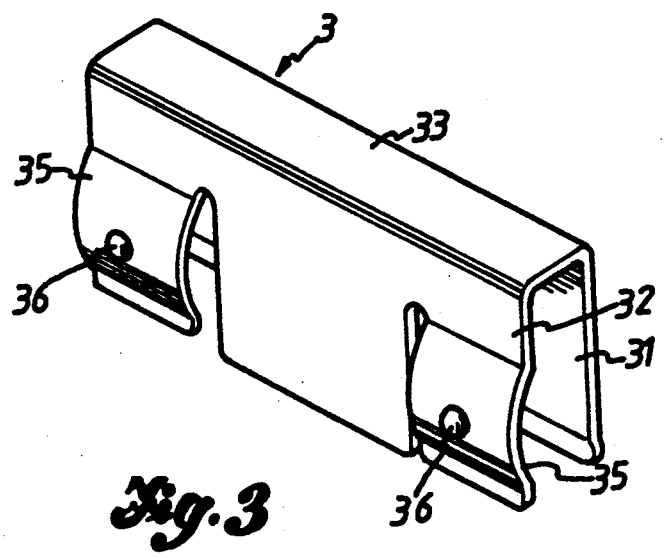
FIG. 3 is another perspective view of the embodiment of the computer casing connector shown in FIG. 2.

Referring now to FIG. 2 and 3, a casing connector 3 comprises a U-shaped body 33 (which is shown up-side-down in the FIGURES) made of resilient and electrically conductive material. The first limb 31 of the U-shaped body 33 has a plurality of snap catches 34 which are parts of the limb 31 cut off along three edges with the fourth edge connecting to limb 31. The cut-off portions are bent and inclined inwards. The second limb 32 of the U-shaped body 33 has a plurality of arcuate members 35 forming part of the second limb 32 but being cut off the second limb 32 so as to be deformable when depressed. The arcuate members 35 are generally parallel with the bottom of the U-shaped body 33 and a small projection 36 is formed on each of the arcuate members 35.

Referring back to FIG. 1 and also referring to FIG. 5, to fix the casing connector 3 to the computer casing, a plurality of holes 21, corresponding to the snap catches 34 formed on the first limb 31 and complemental in shape and size to the snap catches 34, are formed along the edge of the lower piece 2. The casing connector 3 is fixed on the lower piece 2 with, apparently, the thickness of the lower piece 2 less than the distance between the first limb 31 and the second limb 32. As the upper piece 1 is put on the lower piece 2 (FIG. 5), the side plate 11 of the upper piece 1 pushes and depresses the deformable arcuate members 35 inwards and thus forms a tight contact therebetween. With the snap catches 34 trapped inside the holes 21, the casing connector 3 is securely fixed between the upper and lower pieces 1 and 2, even when the upper piece 1 is moved along the arrow 5.

Figure 6:
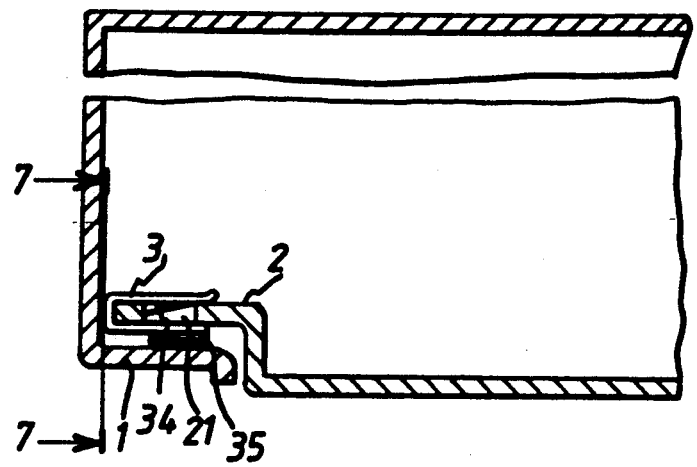
FIG. 6 is a cross-sectional view showing the application of the embodiment shown in FIG. 4.
Figure 7:
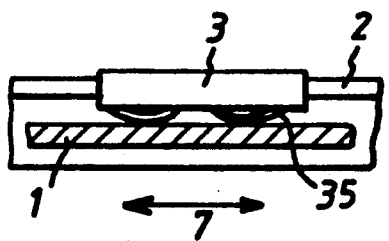
FIG. 7 is a cross-sectional view taken along line 7—7 of FIG. 6.

Referring now to FIG. 4, wherein another embodiment is shown, the deformable arcuate members 35 of the second limb 32 may be formed generally perpendicular to the bottom of the U-shaped body 3. This design is good for another type of computer casing, as shown in FIG. 6 and 7. In this case, the upper casing piece 1 is slidable with respect to the lower piece 2 along the arrow 7 shown in FIG. 7. If viewed in FIG. 6, the upper casing 1 is movable along the direction normal to the paper of the drawings. Similar to the situation of FIG. 5, the deformable arcuate members 35 will be depressed inwards when the upper piece 1 is assembled on the lower piece 2.

It is apparent that although the invention has been described in connection with the preferred embodiments, it is contemplated that those skilled in the art may make changes to certain features of the preferred embodiments without altering the overall basic function and concept of the invention and without departing from the spirit and scope of the invention, as defined in the appended claims.

What is claimed is:

1. A computer casing connector used to provide a tight spatial contact and an electrical connection between an upper piece and a lower piece of a computer casing, comprising an electrically conductive U-shaped body having a bottom, a first limb and a second limb, said first limb having a plurality of snap catches which are parts of said first limb being cut off along part of the edge thereof and bent inwards, said second limbs having a plurality of arcuate members which are parts of said second limbs being so cut off said second limb as to be deformable upon depressed, said lower piece having a plurality of holes, corresponding to said snap catches and complemental in shape and size to said snap catches, formed on edges thereof to engage with and trap therein said snap catches so as to securely fix said computer casing connector thereon.

2. A computer casing connector as claimed in claim 1, wherein said arcuate members of said second limb are generally parallel with said bottom of the U-shaped body.

3. A computer casing connector as claimed in claim 1, wherein said arcuate members of said second limb are formed perpendicular to said bottom of said U-shaped body.

4. A computer casing connector as claimed in claim 1, wherein each of said arcuate members of said second limb has a small projection formed on the top thereof.

5. A computer casing connector as claimed in claim 1, wherein the number of said snap catches is two.

6. A computer casing connector as claimed in claim 1, wherein the number of said arcuate members is two.

* * * * *

UNITED STATES PATENT AND TRADEMARK OFFICE
CERTIFICATE OF CORRECTION

PATENT NO. : 5,015,802
DATED : May 14, 1991
INVENTOR(S) : Chi Liu

It is certified that error appears in the above-indentified patent and that said Letters Patent is hereby corrected as shown below:

On the title page, item [75], Inventor: Please delete "Liu Chi" and substitute -- Chi Liu --.

On the title page, item [19], "Chi" should be -- Liu --.

Signed and Sealed this

Fourth Day of October, 1994

Attest:

BRUCE LEHMAN

Attesting Officer

Commissioner of Patents and Trademarks